US 6,528,000 B2

(12) United States Patent
Yoshiike

(10) Patent No.: US 6,528,000 B2
(45) Date of Patent: Mar. 4, 2003

(54) MOLDING APPARATUS FOR USE IN MANUFACTURE OF RESIN SHIELDING SEMICONDUCTOR DEVICE

(75) Inventor: Kazuaki Yoshiike, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 37 days.

(21) Appl. No.: 09/782,163

(22) Filed: Feb. 14, 2001

(65) Prior Publication Data

US 2001/0016368 A1 Aug. 23, 2001

(30) Foreign Application Priority Data

Feb. 22, 2000 (JP) .......................................... 2000-044478

(51) Int. Cl.⁷ ............................................. H01L 23/28
(52) U.S. Cl. .................................. 264/272.17; 425/543
(58) Field of Search ..................... 264/272.17; 425/543, 425/116–7, 544; 29/75.01

(56) References Cited

U.S. PATENT DOCUMENTS

| 5,275,546 A | * | 1/1994 | Fierkens | 249/95 |
| 5,326,243 A | * | 7/1994 | Fierkens | 264/272.17 |
| 5,349,136 A | * | 9/1994 | Abe et al. | 174/52.2 |
| 5,635,220 A | * | 6/1997 | Izumi et al. | 264/272.17 |

* cited by examiner

Primary Examiner—Long Pham
Assistant Examiner—Thanh V Pham
(74) Attorney, Agent, or Firm—Junichi Mimura

(57) ABSTRACT

A molding equipment for a resin shielding semiconductor device includes a lower platen having a lower cavity, and an upper platen having an upper cavity, and a recess which is adjacent to the upper cavity. A lead frame has an opening serving as a passage of resin. The opening has one end rounded.

1 Claim, 8 Drawing Sheets

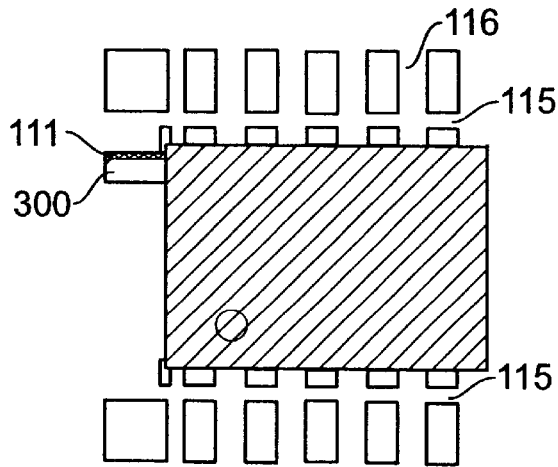
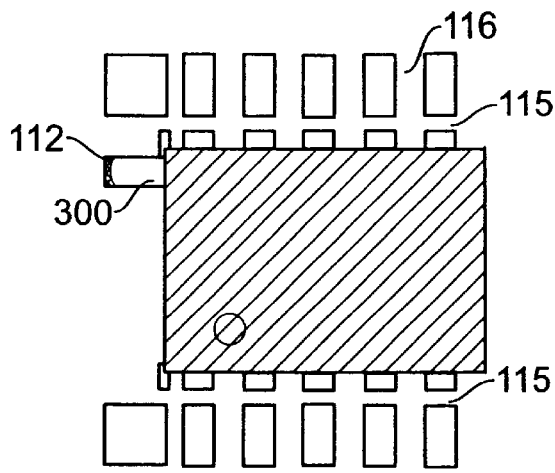
FIG. 7A    FIG. 7B
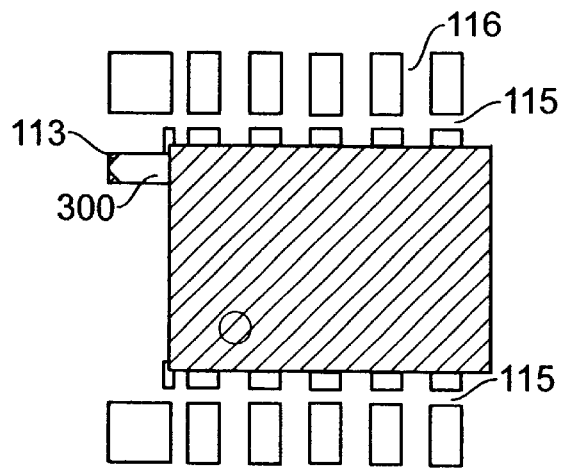
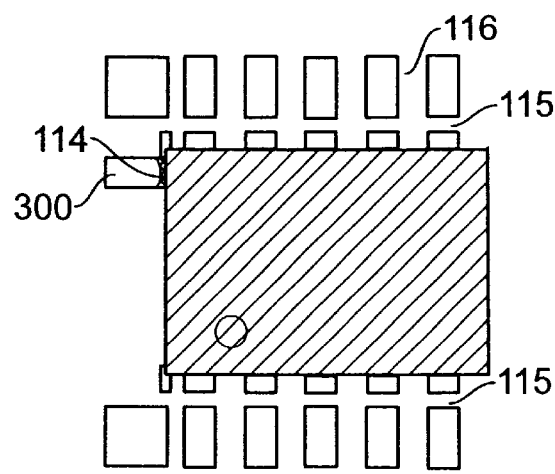
FIG. 7C    FIG. 7D
PRIOR ART

MOLDING APPARATUS FOR USE IN MANUFACTURE OF RESIN SHIELDING SEMICONDUCTOR DEVICE

CROSS-REFERENCE TO RELATED APPLICATION

This application claims the priority benefit of Japanese Patent Application No. 2000-044478, filed Feb. 22, 2000, the entire disclosure of which is incorporated herein by reference.

BACKGROUND OF THE INVENTION

1. Field of the Invention

The invention relates to a molding apparatus for a resin shielding semiconductor device, a lead frame for the device from which surplus resin can be detached without burrs, and a method for removing without burrs surplus resin attached to a semiconductor device formed using the molding apparatus.

2. Description of the Related Art

A conventional process for encapsulating a semiconductor device with a resin material is shown in FIGS. 6A through 6D. Referring to FIG. 6A, a semiconductor chip 100 mounted on a lead frame 102 is set in a molding apparatus 500. The molding apparatus 500 includes an upper platen 201 and a lower platen 211. The upper platen 201 has a cull 202, an upper resin passage 213a and an upper cavity 203, and the lower platen 211 has a transfer pot 212, a lower resin passage 213b, a gate 214 and a lower cavity 215. The lower resin passage 213b has a rearward region 213b' and forward region 213b'', which is thinner than the rearward region 213b'. The lead frame 102 is placed between the lower platen 211 and the upper platen 201 as the semiconductor chip is located in the center of the lower cavity 215 and the upper cavity 203. A tablet 301 of the resin material is placed in the transfer pot 212.

Referring to FIG. 6B, the lead frame 102 is placed on the lower cavity wherein one end of the lead frame 102 is sandwiched by the upper and lower cavities 203 and 215, and other end is extended to the gate 214 and the runner 213, which are formed in the lower platen 211. Then, the upper platen 201 is moved toward the lower platen 211 until the upper platen 201 contacts the lower platen 211 so that a space 217 is formed by the upper and lower cavities 203 and 215, and a runner 213 is formed by contacting the upper resin passage 213a to the lower resin passage 213b. As a result, the semiconductor chip 100 is located in a center of the space 217, and the lead frame 102 is sandwiched by the upper and lower platen 201 and 211. Then, the tablet 301 in the transfer pot 212 is heated until it melts completely. Then, the melted resin is pushed out from the bottom with an unillustrated plunger to the cull 202 and the runner 213 and it reaches, to the gate 214 as shown in FIG. 6C.

Referring to FIG. 6D, the melted resin passes through an opening 300 of the lead frame 102 and the gate 214, and enters the space 217. As descried above, since the semiconductor chip 100 has been placed in the space 217, it is encapsulated with the melted resin. Then, the melted resin is further heated for a particular period and solidifies as it cools down to room temperature.

After the melted resin is solidified, surplus resin remaining in the runner 213 and the cull 202, is detached from the resin solidified in the space 217 at the gate 214 so as to complete the semiconductor device 101.

However, residual burrs of the surplus resin sometimes remain in the opening 300 of the lead frame 102, because of a requirement of the gate shape. That is, since the surplus resin remained in the runner 213 should be detached from the gate to complete the semiconductor device, the size of the gate 214 should as be small as possible to permit the surplus resin to be broken easily. For this purpose, the forward region 213b'' of the lower resin passage 213b is formed thinner than other region.

As a result of this configuration, residual burrs may remain, as illustrated in reference to FIGS. 7A through 7D. For example, a residual burr 111 of the surplus resin may remain at one side of the runner 213 (FIG. 7A), or a residual burr 112 of the surplus resin may remain in the runner 213 (FIG. 7B). Also, a residual burr 113 of the surplus resin may remain at both sides of the runner 213 (FIG. 7C). A further possibility is that a residual burr 114 of the surplus resin may remain at the gate 214 (FIG. 7D).

Therefore, a deflashing process for removing the residual burrs is required when the resin shielding semiconductor device is manufactured by the molding apparatus described above.

SUMMARY OF THE INVENTION

An objective of the invention is to resolve the issue described above, and to provide a molding apparatus for a resin shielding semiconductor device including a lower platen having a lower cavity, a lower resin passage and a gate to connect the lower resin passage to the lower cavity, the lower passage having a region of reduced thickness adjacent to the gate, and an upper platen having an upper cavity, an upper resin passage and a recess, the upper resin passage being connected to the lower resin passage to form a runner when the one of the platens is moved toward the other until they contact, the recess being formed adjacent to the upper cavity at the location that corresponds to the region when the lower and upper platens are contacted.

A further objective of the invention is to provide a lead frame including a first region in which a semiconductor chip can be encapsulated with resin, and a second region in which an opening is formed, the opening having one end, which extends to the first region, and opposite end being rounded.

Another objective of the invention is to provide a method for removing surplus resin from a semiconductor device without leaving burrs including providing a molding apparatus including a lower platen having a pot, a lower cavity, a lower resin passage and a gate to connect the lower resin passage to the lower cavity, the lower passage having a region of reduced thickness adjacent to the gate, and an upper platen having a cull, an upper cavity, an upper resin passage which is connected to the cull and a recess, the recess being formed adjacent to the upper cavity at the location that corresponds to the region when the lower and upper platens are contacted, placing a lead frame on which a semiconductor chip is mounted, on the lower platen, the lead frame having an opening, moving one of the platens toward the other until they contact to connect the upper resin passage to the lower resin passage to form a runner, and whereby the semiconductor chip is enclosed in a space which is formed by the cavities, placing a resin tablet in the pot, and heating the tablet until it melts, transferring the melted resin to the runner via the cull and the recess, and injecting the melted resin from the gate through the opening of the lead frame, solidifying the melted resin in the space, the runner, the cull and the recess, providing a degating apparatus including a movable plate, a binder, a revolved shaft and a lifting device, placing the lead frame having the solidified resin, on the plate, and fixing the solidified resin formed in the cull by the binder and lifting the plate, and turning the plate on the shaft to break the solidified resin which was formed at a location corresponding to the gate.

BRIEF DESCRIPTION OF THE DRAWINGS

The invention will be more particularly described with reference to the accompanying drawings in which:

FIGS. 4A through 4D are sequential sectional views showing a method for detaching surplus resin;

FIGS. 7A through 7D are plan views of semiconductor devices, each having residual burrs of surplus resin.

DETAILED DESCRIPTION OF THE PREFERRED EMBODIMENTS

Figure 1:
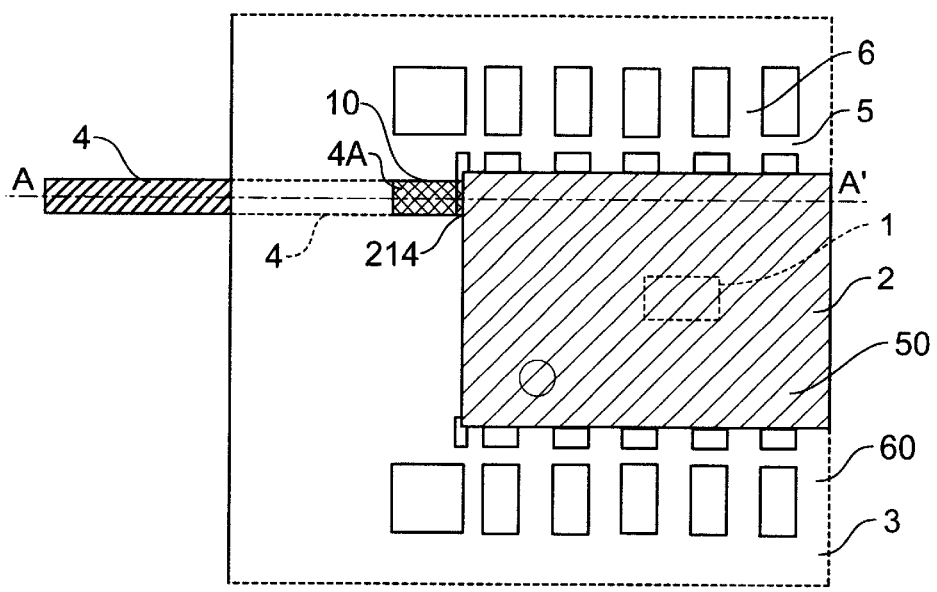
FIG. 1 is a plan view of a semiconductor device having surplus resin, which is formed by a molding apparatus of a first embodiment of the invention.
Figure 2:
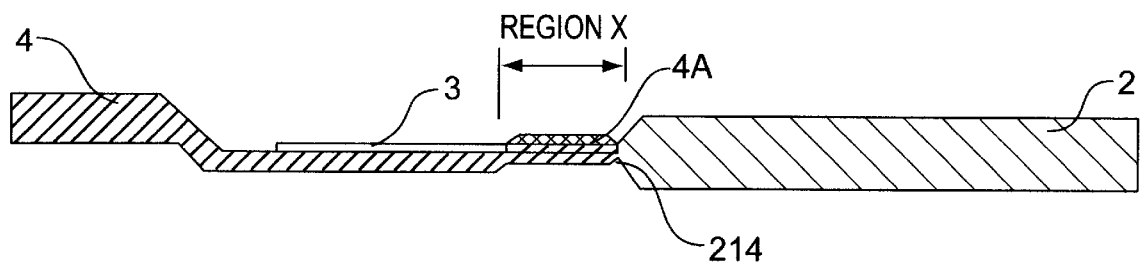
FIG. 2 is a side sectional view taken on line A–A' of FIG. 1.

Referring to FIGS. 1 and 2, a semiconductor device 2 prior to its separation from a lead frame 3 and a molding apparatus is shown. Surplus resin 4 is shown attached to the semiconductor device 2, and a tie bar 5 of the lead frame 3 not cut yet to form leads 6. A protuberant resin 4A is intentionally formed in a region X adjacent to a gate 214. A semiconductor chip 1 is sealed with solidified resin in a first region 50 of the lead flame 3, and an opening 10 of the lead frame 3 serving a passage for the resin is formed in a second region 60 of the lead frame 3, which is not sealed.

Figure 3A:
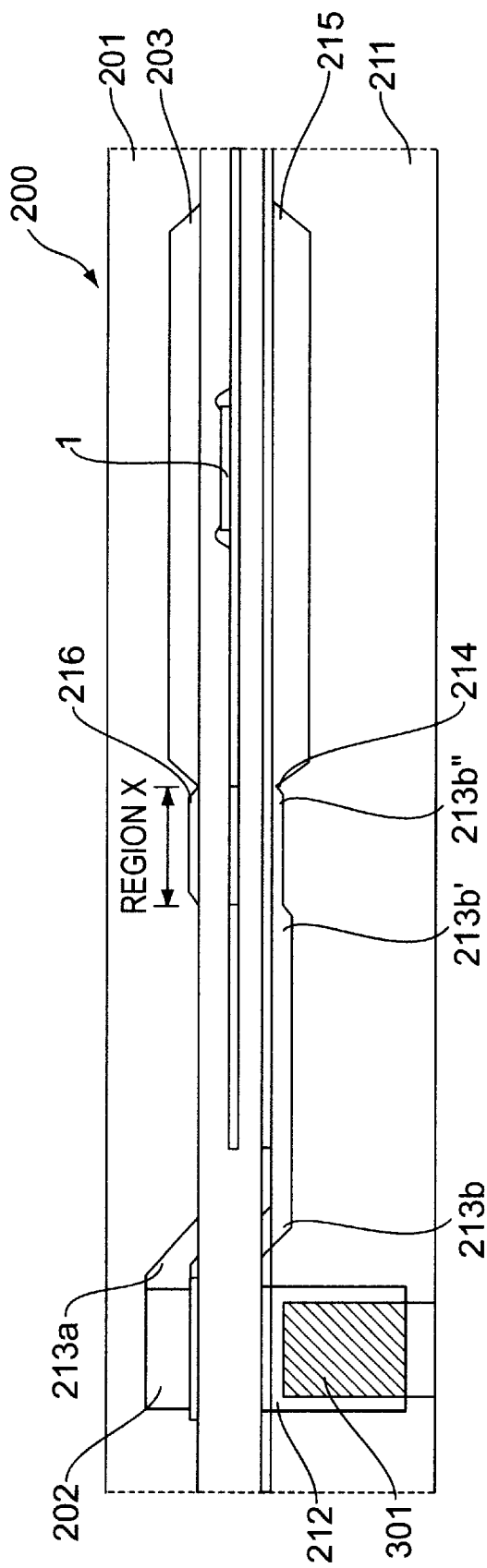
FIGS. 3A through 3D are sequential sectional views of a method for encapsulating a semiconductor chip with resin using the molding apparatus of FIGS. 1 and 2.
Figure 3B:
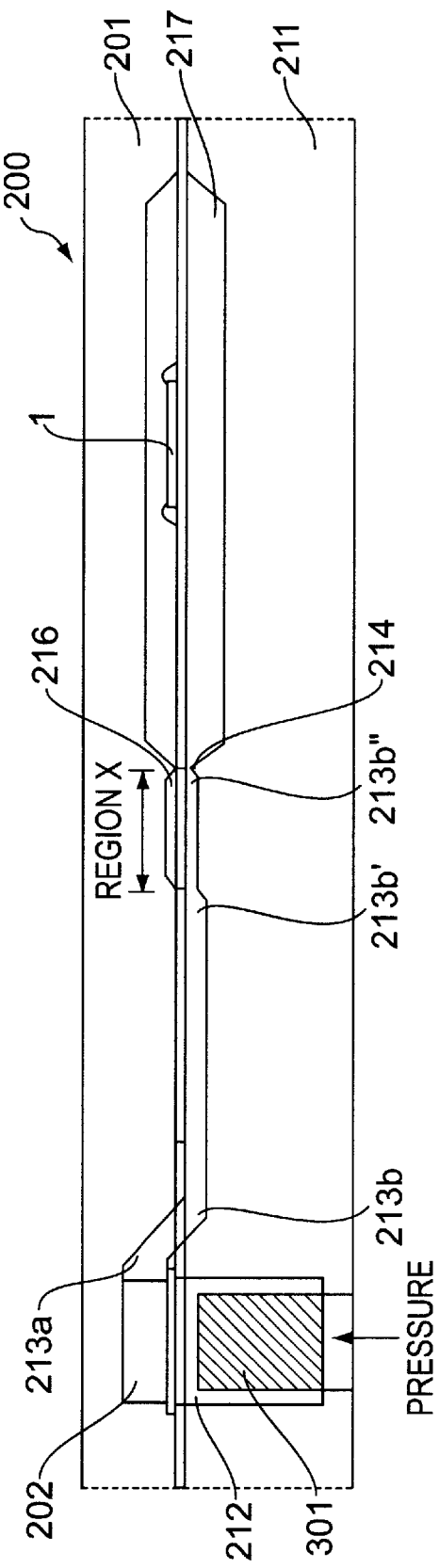

A process for manufacturing the semiconductor device using a molding apparatus 200 is explained below with reference to FIG. 3A through FIG. 3D. Referring to FIG. 3A, the molding apparatus 200 includes an upper platen 201 and a lower platen 211. The upper platen 201 includes a first cavity 203, a recess 216, a first resin passage 213a and a cull 202. The lower platen 211 includes a second cavity 215, a second resin passage 213b, a gate 214 and a transfer pot 212. The second resin passage 213b has a rearward region 213b' and a forward region 213b", which is thinner than the rearward region 213b'. A resin tablet 301 is placed in the transfer pot 212. As illustrated in FIG. 3A, the recess 216 is formed in the upper platen 201 at the region X. That is, the recess 216 is directly over the forward region 213b" when the upper platen 201 is moved toward the lower platen 211 to sandwich the lead frame 3 on which a semiconductor chip 1 is mounted as illustrated in FIG. 3B By moving the upper platen 201 toward the lower platen 211 until the upper platen 201 contacts the lower platen 211, a space 217 is formed by the first cavity 203 and the second cavity 215, and the runner 213 for transferring a melted resin to the space 217 is formed by connecting the first resin passage 213a to the second resin passage 213b. Then, the resin tablet 301 in the transfer pot 212 is heated until it melts, and then an unillustlated plunger brings pressure on the melted resin from below.

Figure 3C:
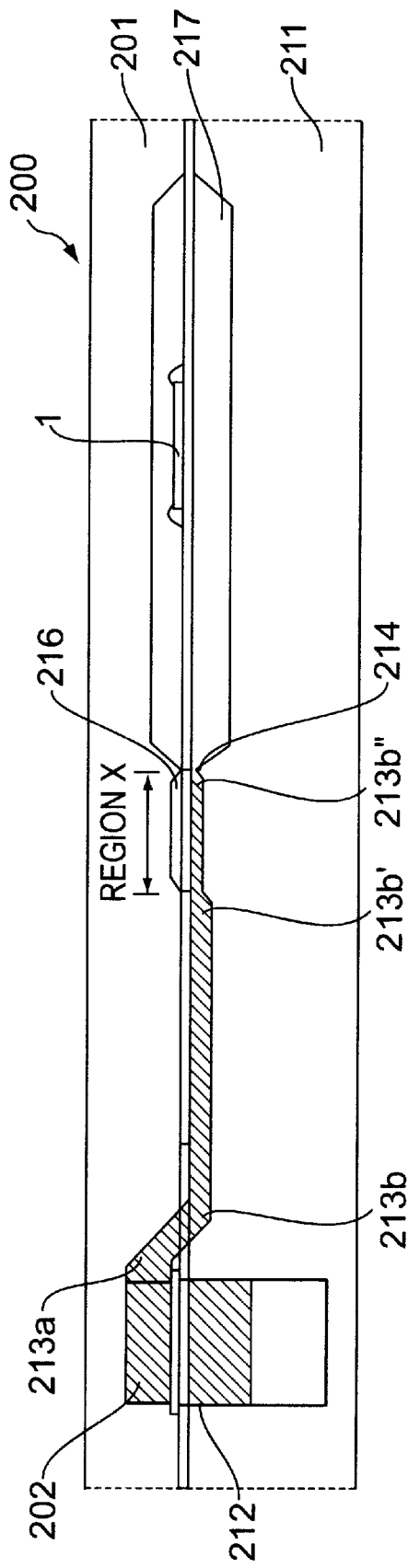
Figure 3D:
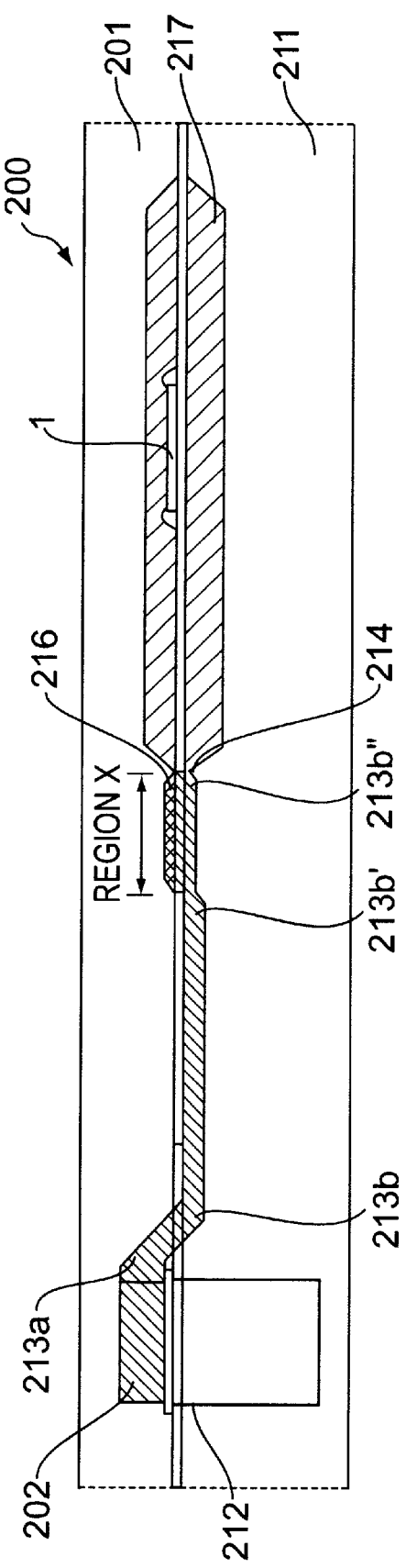

Referring to FIG. 3C, the melted resin flows under pressure through the cull 202 and the runner 213 to the gate 214. Referring to FIG. 3D, the space 217 is filled with the melted resin, which is injected from the gate 214. Simultaneously, the recess 216 also is filled with the melted resin so that protuberant resin 4A is formed therein. As described above, since the semiconductor chip 1 is placed in the space 217, it is encapsulated with the melted resin. Then, the melted resin is further heated for a particular period, and is solidifies as it cools down to room temperature.

However, in the state shown in FIG. 3D, surplus resin 4 remaining in the runner 213 and in the cull 202 also is solidified, and it is unified with the solidified resin in the space 217. Therefore, it is necessary to break the surplus resin 4 at the location of the gate 214. The following is a description of a process for removing the surplus resin from the gate 214 (called "degating process").

Figure 4A:
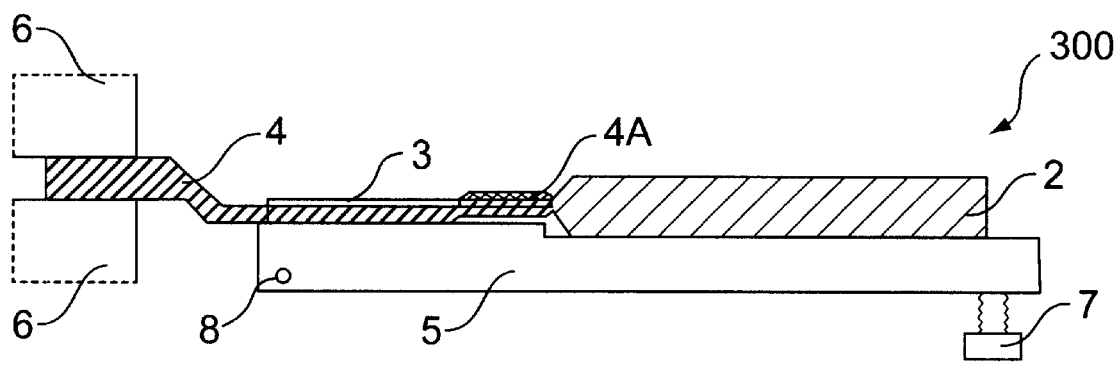

Referring to FIG. 4A, a degating device 300 is illustrated. The degating device 300 includes a movable plate 5, a binder 6 and a lifting device 7. The semiconductor device 2 and the lead frame 3 are placed on the movable plate 5, and the surplus resin 4 having been solidified in the cull, is fixed by the binder 6. FIG. 4A is a sectional view taken on line A–A' of FIG. 1, so that the surplus resin 4, which was solidified in the runner 213, seems in the drawing to be placed on the plate 5. However, an opening is formed in the plate 5 under the surplus resin 4, and the lead frame 3 is placed on the plate 5. The plate 5 has a revolved shaft 8 adjacent to its one end, which is close to the binder 6. On the other end of the plate 5, the lifting device 7, such as a jack is placed under the plate 5.

Figure 4B:
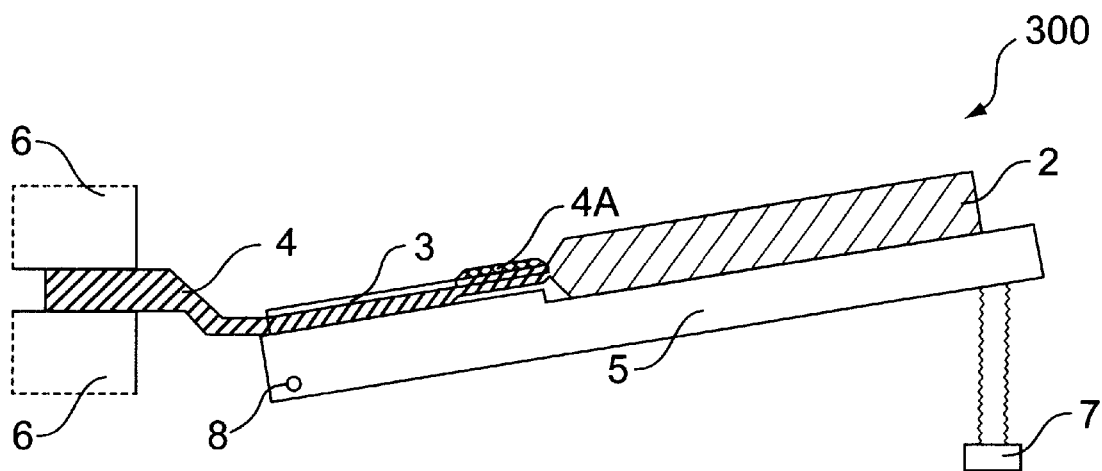

Referring to FIG. 4B, the jack 7 lifts the plate 5, and turns it on the shaft 8, hereby to apply stress to the surplus resin 4. Then, referring to FIG. 4C, when the stress applied to the surplus resin 4 reaches a maximum, the surplus resin 4 is broken where it is thinnest, i.e., at the gate 214. At this time, the protuberant resin 4A, which was solidified in the recess 21 and which is unified with the surplus resin 4, also is detached from the resin which was solidified in the space 217.

Comparing the above embodiment to the related art, since the surplus resin 4 in the forward region 213b" of the lower passage 213b adjacent to the gate 214 becomes thicker than in the related art because of the protuberant resin 4A intentionally formed in the recess 216, the surplus resin is completely removed from the lead frame 3. Therefore, no burrs attached to the lead frame 3 are remained.

According to the first embodiment, the recess 216 is provided to form the protuberant resin 4A therein so that the surplus resin in the forward region 213b" of the lower passage 213b adjacent to the gate 214 becomes thicker.

Figure 5A:
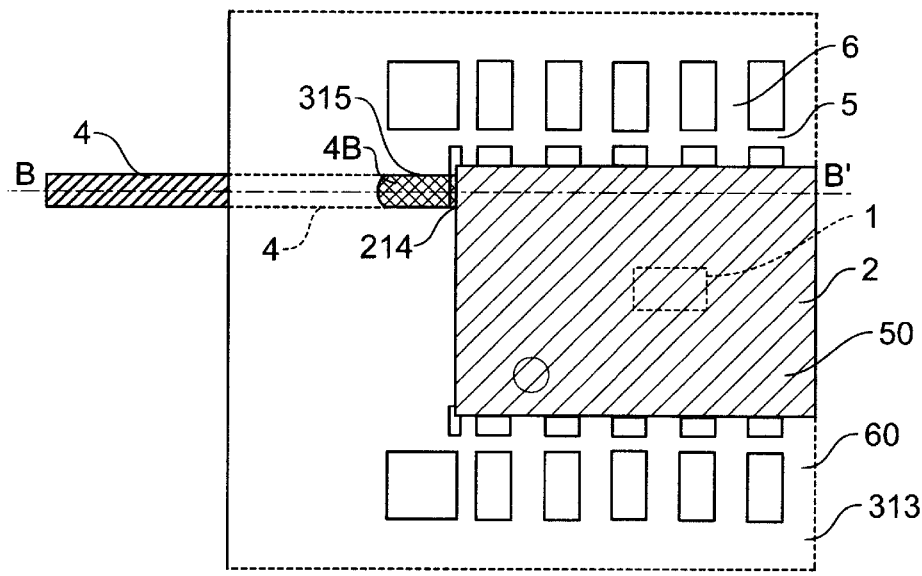
FIG. 5A is a plan view of a semiconductor device having surplus resin, which is formed by a molding apparatus of a second embodiment of the invention.
Figure 5B:
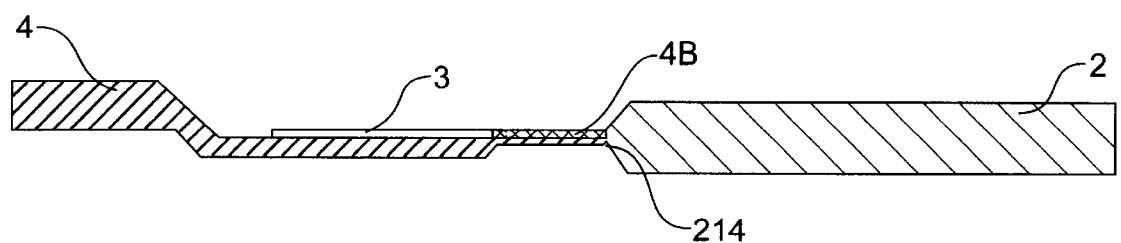
FIG. 5B is a side sectional view taken on line B–B' of FIG. 5A.
Figure 6A:
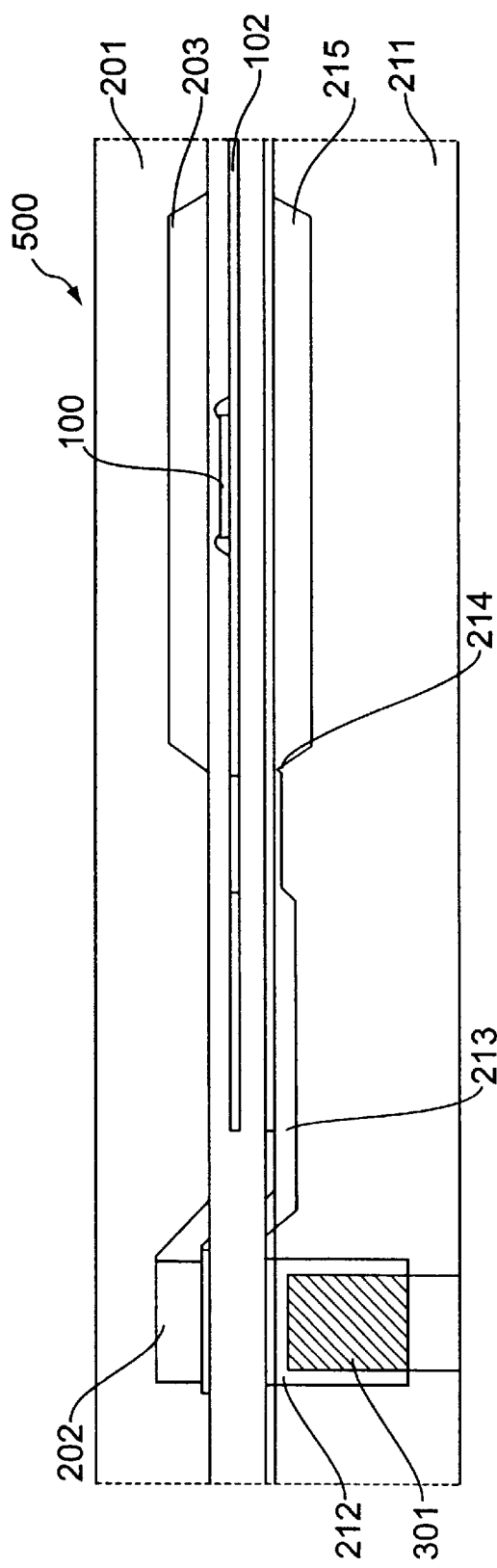
FIGS. 6A through 6D are sequential sectional views of a method for encapsulating a semiconductor chip with resin using conventional molding apparatus.
Figure 6B:
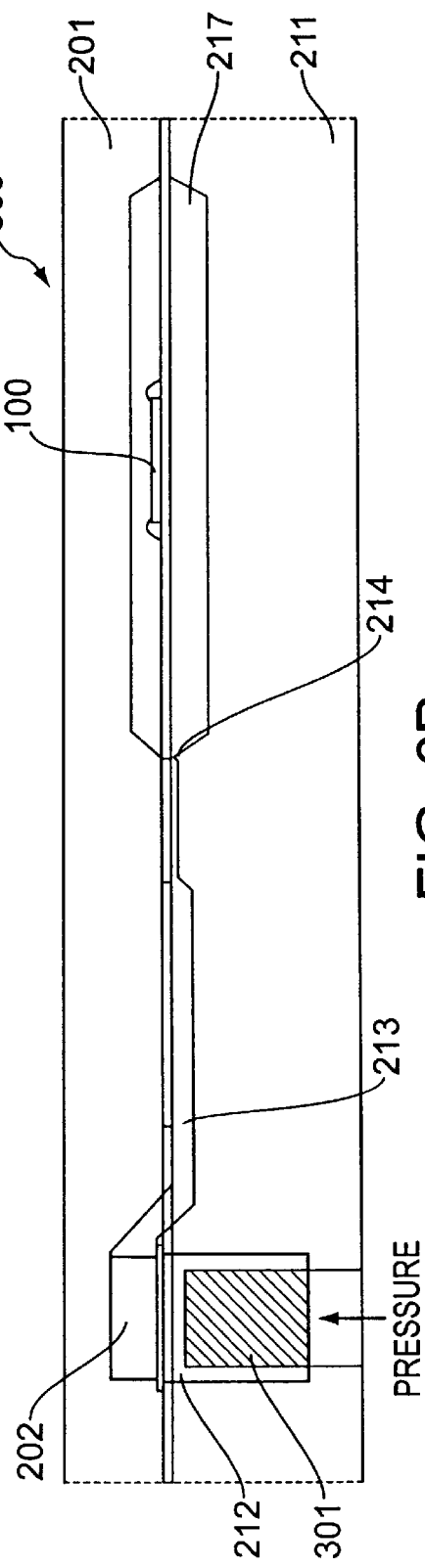
Figure 6C:
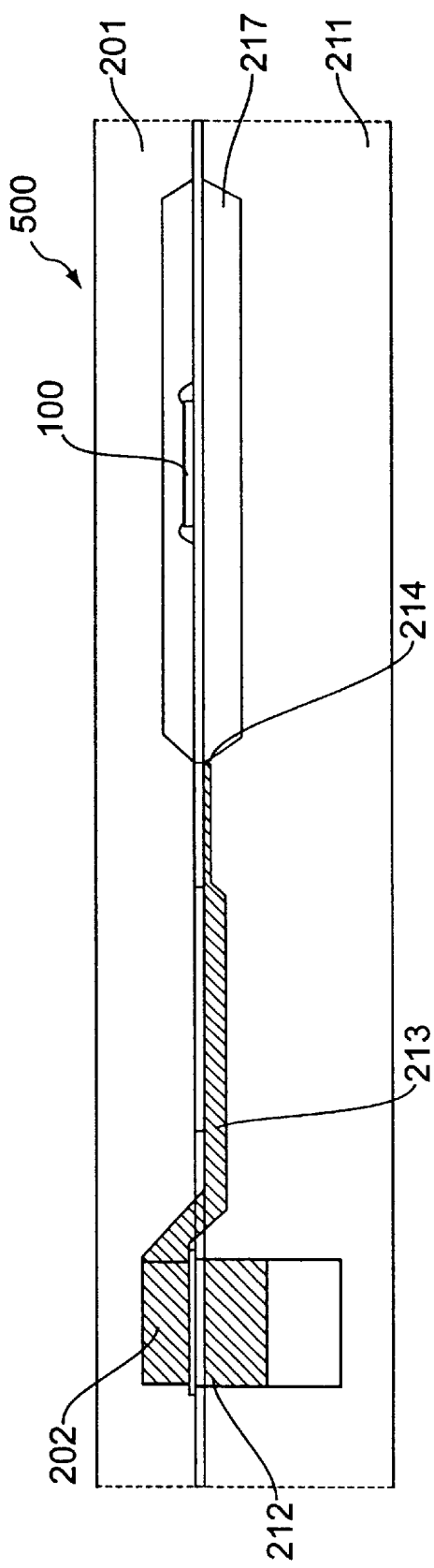
Figure 6D:
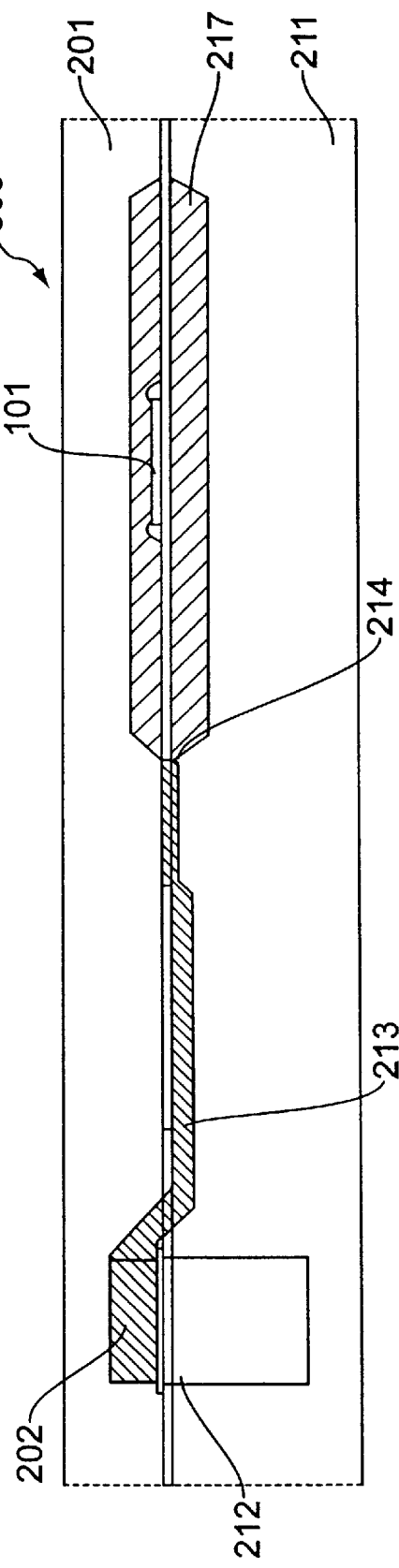

A second embodiment provides an improved lead frame, which can be used for any molding apparatus including the molding apparatus 200 of the first embodiment. Referring to FIG. 5, as well as the lead frame 3 used in the first embodiment or used in the related arts, a lead frame 313 has an opening 315 for serving a passage for the melted resin to a gate 214. In the lead frame 3 used in the first embodiment and the related arts, the opening 10 is formed rectangularity. However, the side of the opening 315 opposite to the gate 214 is rounded in the second embodiment. Therefore, when the process shown in FIGS. 3A through 3D is performed, thin surplus resin 4B, which is rounded at one side, is formed in the opening 315 located on the forwarding region 213b″ of the lower passage 213b.

Figure 4C:
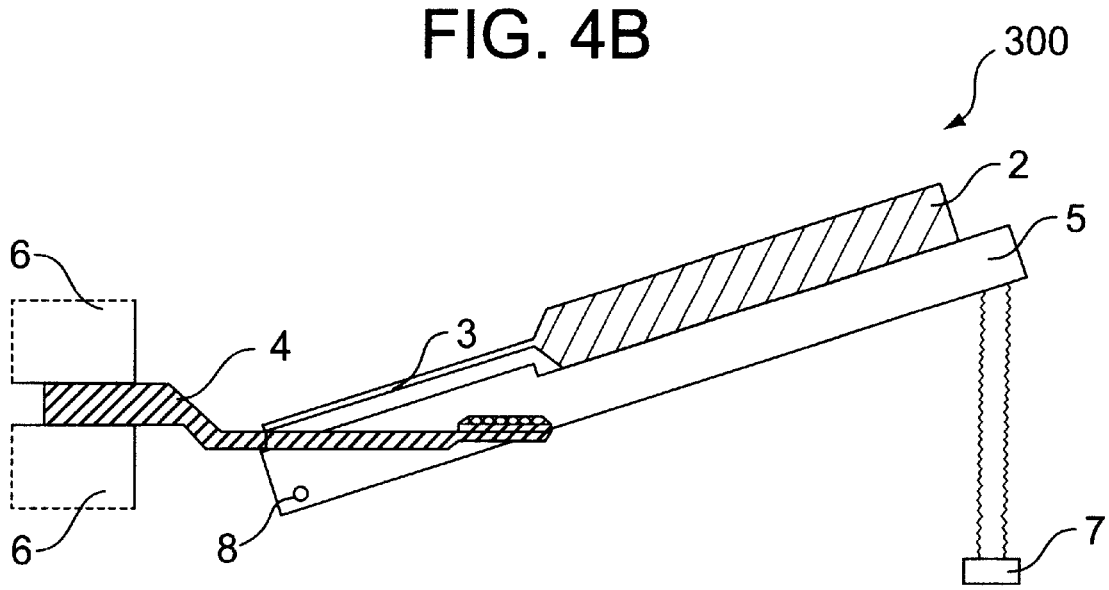

After that, the same degating process illustrated in FIGS. 4A through 4C is performed. In the related arts, some residual burrs remain at the corners of the openings formed in the lead frames, as described above (See FIG. 7B or FIG. 7C). It could be considered that the rectangularity shaped opening causes this problem. However, in this embodiment, one side of the opening is rounded. Therefore, according to this embodiment, the surplus resin 4 and the thin surplus resin are unified and they are detached from the gate 214 and no burrs remains in the opening 315.

While the invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A molding apparatus for a resin shielding semiconductor device, comprising:

a lower platen having a lower cavity, a lower resin passage and a gate to connect the lower resin passage to the lower cavity, the lower passage having a first region and a second region including a slope region, the lower passage having a first depth in the first region and having a second depth, which is thinner than the first depth, in the second region, and one end of the second region being connected to the first region and the other end of the second region being connected to the gate with the slope region; and an upper platen having an upper cavity, an upper resin passage and a recess, the upper resin passage being connected to the lower resin passage to form a runner after one of the platens is moved toward the other until they contact, the recess being formed in an area corresponding to the second region when the lower and upper platens are contacted, and the length of the recess being the same as that of the lower resin passage in the second region.

* * * * *